(12) United States Patent
Itoyama et al.

(10) Patent No.: US 12,384,671 B2
(45) Date of Patent: Aug. 12, 2025

(54) MEMS MICROPHONE

(71) Applicants: Kazuki Itoyama, Tokyo (JP); Hajime Kano, Tokyo (JP); Yuki Uchida, Tokyo (JP); Takuma Yoshida, Tokyo (JP); Mitsuaki Daio, Tokyo (JP); Yasuhiro Horimoto, Tokyo (JP)

(72) Inventors: Kazuki Itoyama, Tokyo (JP); Hajime Kano, Tokyo (JP); Yuki Uchida, Tokyo (JP); Takuma Yoshida, Tokyo (JP); Mitsuaki Daio, Tokyo (JP); Yasuhiro Horimoto, Tokyo (JP)

(73) Assignee: MMI SEMICONDUCTOR CO., LTD., Tokyo (JP)

( * ) Notice: Subject to any disclaimer, the term of this patent is extended or adjusted under 35 U.S.C. 154(b) by 398 days.

(21) Appl. No.: 18/187,820

(22) Filed: Mar. 22, 2023

(65) Prior Publication Data

US 2023/0303388 A1    Sep. 28, 2023

(30) Foreign Application Priority Data

Mar. 25, 2022  (JP) ................................ 2022-049224

(51) Int. Cl.
*B81B 3/00*    (2006.01)
(52) U.S. Cl.
CPC .... *B81B 3/0021* (2013.01); *B81B 2201/0257* (2013.01); *B81B 2203/0127* (2013.01); *B81B 2203/0315* (2013.01); *B81B 2203/0353* (2013.01); *B81B 2203/04* (2013.01); *B81B 2207/015* (2013.01)

(58) Field of Classification Search
CPC ......... B81B 3/0021; B81B 2201/0257; B81B 2203/0127; B81B 2203/0315; B81B 2203/0353; B81B 2203/04; B81B 2207/015; B81B 7/0077; H04R 2410/03;
(Continued)

(56) References Cited

U.S. PATENT DOCUMENTS 9,438,979 B2 *  9/2016  Dehe ...................... H04R 19/04
9,961,451 B2 *  5/2018  Nicollini .............. H04R 19/005
(Continued)

FOREIGN PATENT DOCUMENTS

JP    2006-101302    4/2006
JP    2011-259410    12/2011

*Primary Examiner* — Angelica M McKinney
(74) *Attorney, Agent, or Firm* — IPUSA, PLLC (57) ABSTRACT

A MEMS microphone includes a diaphragm having conductivity, first and second variable capacitors respectively including first and second fixed electrodes, a first voltage output section that outputs a first voltage changed according to a change in a capacitance of the first variable capacitor, and a second voltage output section that outputs a second voltage changed according to a change in a capacitance of the second variable capacitor. The first and second fixed electrodes face the diaphragm. The capacitances of the first and second variable capacitors are changed in accordance with a vibration of the diaphragm. A first bias voltage is applied to the first fixed electrode. A reference voltage is applied to the second fixed electrode. A second bias voltage is applied to the diaphragm. A difference between the second bias voltage and the reference voltage is half of a difference between the first bias voltage and the reference voltage.

7 Claims, 9 Drawing Sheets

(58) Field of Classification Search
CPC . H04R 3/06; H04R 19/04; H04R 1/04; H04R 19/005; H04R 3/005; B81C 1/00182
See application file for complete search history.

(56) References Cited

U.S. PATENT DOCUMENTS

| | | | |
|---|---|---|---|
| 11,932,533 B2* | 3/2024 | Fueldner | ............. B81C 1/00182 |
| 2010/0266145 A1 | 10/2010 | Aimo Suvanto | |
| 2011/0280419 A1 | 11/2011 | Kasai | |
| 2015/0125003 A1* | 5/2015 | Wiesbauer | ............ B81B 7/0077 |
| | | | 438/51 |
| 2015/0281818 A1* | 10/2015 | Doller | .................. H04R 19/005 |
| | | | 381/111 |
| 2018/0167741 A1* | 6/2018 | Uchida | ................. H04R 19/005 |
| 2019/0081598 A1 | 3/2019 | Albers et al. | |
| 2021/0029469 A1* | 1/2021 | Wiesbauer | ............. H04R 3/005 |

* cited by examiner

MEMS MICROPHONE

CROSS-REFERENCE TO RELATED APPLICATIONS

This application is based on and claims priority to Japanese Patent Application No. 2022-49224, filed Mar. 25, 2022, the entire contents of which are incorporated herein by reference.

BACKGROUND OF THE INVENTION

1. Field of the Invention

The present disclosure relates to a microphone and particularly relates to a micro electro mechanical systems (MEMS) microphone using MEMS technology.

2. Description of the Related Art

With reduction in the size and the weight of devices, reduction in the size and the weight of microphones mounted on the devices is required. Accordingly, a MEMS microphone using a micro electro mechanical systems (MEMS) technology is being developed. For example, the MEMS microphone includes a variable capacitor including a conductive diaphragm provided on a semiconductor substrate and a conductive back plate fixed to the semiconductor substrate so as to cover the diaphragm. The MEMS microphone converts sound pressure into an electric signal by detecting, as a voltage, a change in the capacitance of the variable capacitor in accordance with the vibration of the diaphragm caused by the sound pressure (see, for example, Patent Document 1).

In the MEMS microphone, a method, in which the diaphragm and the back plate, to which voltages of opposite polarities are applied, are respectively connected to inputs of an amplifier, to generate differential signals in accordance with the sound pressure, is known (for example, see Patent Document 2). Additionally, in the MEMS microphone, a method, in which the back plates are respectively disposed on both sides of the diaphragm to generate differential signals in accordance with the sound pressure, is known (for example, see Patent Document 3).

In the MEMS microphone, a method, in which each of multiple back plates facing the diaphragm is selectively connected to the input of the amplifier via a switch to generate a signal in which distortion is suppressed in accordance with the magnitude of the sound pressure, is known (for example, see Patent Document 4). A condenser microphone, in which voltages of opposite polarities are respectively applied to two fixed electrodes to generate differential signals in accordance with the sound pressure, is known (see, for example, Patent Document 5).

RELATED-ART DOCUMENTS

Patent Documents

[Patent Document 1] Japanese Laid-open Patent Application Publication No. 2011-259410
[Patent Document 2] U.S. patent Ser. No. 10/523,162
[Patent Document 3] U.S. patent Ser. No. 10/589,987
[Patent Document 4] U.S. Patent Application Publication No. 2010/0266145
[Patent Document 5] Japanese Laid-open Patent Application Publication No. 2006-101302

SUMMARY OF THE INVENTION

According to one aspect of embodiments of the present disclosure, a micro electro mechanical systems (MEMS) microphone includes a diaphragm having conductivity, a first variable capacitor including a first fixed electrode facing the diaphragm, a capacitance of the first variable capacitor being changed in accordance with a vibration of the diaphragm, a second variable capacitor including a second fixed electrode facing the diaphragm, a capacitance of the second variable capacitor being changed in accordance with the vibration of the diaphragm, a first voltage output section configured to output a first voltage that is changed in accordance with a change in the capacitance of the first variable capacitor, and a second voltage output section configured to output a second voltage that is changed in accordance with a change in the capacitance of the second variable capacitor. A first bias voltage is applied to the first fixed electrode. A reference voltage is applied to the second fixed electrode. A second bias voltage is applied to the diaphragm, a difference between the second bias voltage and the reference voltage being half of a difference between the first bias voltage and the reference voltage.

DESCRIPTION OF THE EMBODIMENTS

In a microphone that uses two fixed electrodes to generate differential signals (a positive-phase signal and a negative-phase signal) in accordance with sound pressure, a positive voltage and a negative voltage are respectively applied to two variable capacitors formed by a diaphragm and the two fixed electrodes. However, when a positive voltage generation circuit that generates the positive voltage and the negative voltage generation circuit that generates a negative voltage are mounted on the microphone, the circuit scale and cost of the microphone increase. Additionally, even when the positive voltage and the negative voltage to be applied to the two variable capacitors can be generated, if the capacitances of the two variable capacitors are not equal to each other, the positive-phase signal and the negative-phase signal having the same amplitude cannot be generated, and differential signals having distortion is generated.

According to the present disclosure, differential signals whose phases are inverted can be generated while an increase in the circuit scale of the MEMS microphone is suppressed.

In the following, embodiments of the present disclosure will be described with reference to the drawings. Hereinafter, a signal line to which a signal is supplied is denoted by a reference symbol the same as a signal name, and a voltage line or a power supply line to which a voltage is supplied is denoted by a reference symbol the same as a voltage name or a power supply name.

Figure 1:
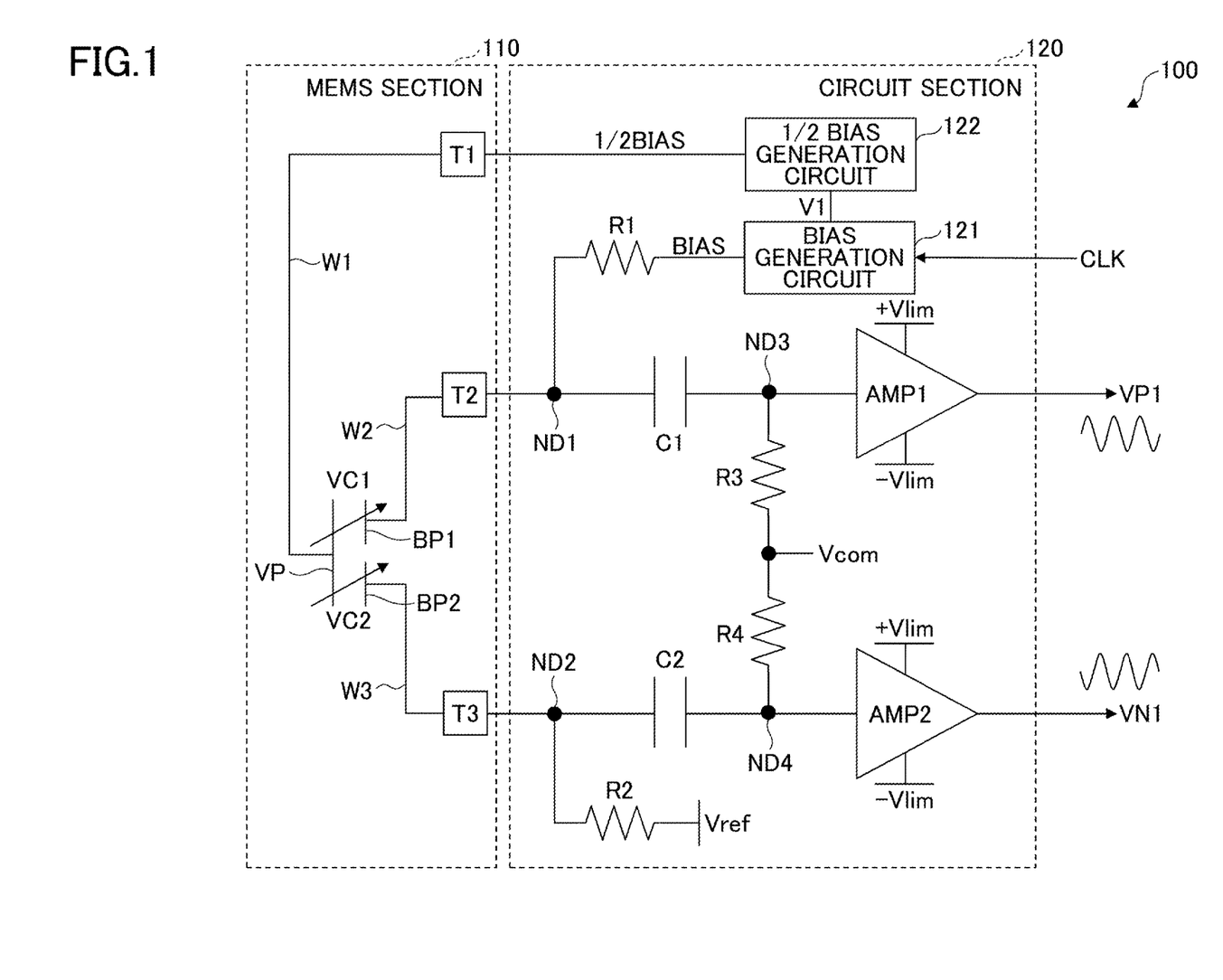
FIG. 1 is a block diagram illustrating an example of a microphone according to a first embodiment.

FIG. 1 is a block diagram illustrating an example of a microphone according to a first embodiment. A microphone 100 illustrated in FIG. 1 includes, for example, a MEMS section 110 formed using the MEMS technology and a circuit section 120. The MEMS section 110 includes a variable capacitor VC1 formed by a diaphragm VP and a fixed electrode BP1 facing each other, and a variable capacitor VC2 formed by the diaphragm VP and a fixed electrode BP2 facing each other.

The fixed electrode BP1 is an example of a first fixed electrode, and the fixed electrode BP2 is an example of a second fixed electrode. The variable capacitor VC1 is an example of a first variable capacitor, and the variable capacitor VC2 is an example of a second variable capacitor.

The areas of the fixed electrodes BP1 and BP2 are equal to each other, and the facing distances between the fixed electrodes BP1 and BP2 and the diaphragm VP are equal to each other. Thereby, the electrical characteristics of the variable capacitors VC1 and VC2 can be made equal to each other, and the amounts of changes in the capacitances of the variable capacitors VC1 and VC2 when the diaphragm VP vibrates due to the sound pressure can be made equal to each other.

The diaphragm VP is provided in common to the variable capacitors VC1 and VC2. The diaphragm VP has conductivity and is connected to the circuit section 120 via a wire W1 and a terminal T1. The fixed electrode BP1 is connected to the circuit section 120 via a wire W2 and a terminal T2. The fixed electrode BP2 is connected to the circuit section 120 via a wire W3 and a terminal T3. The structure of the MEMS section 110 will be described with reference to FIG. 2. For example, the terminals T1, T2, and T3 may be formed as pads.

The circuit section 120 includes a bias generation circuit 121, a ½ bias generation circuit 122, resistive elements R1, R2, R3, and R4, capacitive elements C1 and C2, and amplifiers AMP1 and AMP2. Although not particularly limited, the circuit section 120 is designed as a semiconductor integrated circuit such as an application specific integrated circuit (ASIC). Additionally, with respect to the resistive elements R1, R2, R3, and R4, diodes or the like can be used as the resistive elements in order to achieve high resistance.

One end of the capacitive element C1 is connected to the terminal T2 via a node ND1. The other end of the capacitive element C1 is connected to the input of the amplifier AMP1 via a node ND3. One end of the capacitive element C2 is connected to the terminal T3 via a node ND2. The other end of the capacitive element C2 is connected to the input of the amplifier AMP2 via a node ND4.

The resistive element R1 is disposed between the output of the bias generation circuit 121 and the node ND1. The resistive element R2 is disposed between the node ND2 and a reference voltage line Vref. Thus, the fixed electrode BP2 is set to a reference voltage Vref via the terminal T3, the node ND2, and the resistive element R2. The resistive element R3 is disposed between the node ND3 and a common voltage line Vcom. The resistive element R4 is disposed between the node ND4 and the common voltage line Vcom. The voltage of the common voltage line Vcom is set in accordance with the operating voltage of the amplifiers AMP1 and AMP2, and is, for example, 1 V.

The node ND1 is set to a bias voltage BIAS via the resistive element R1. The node ND3 is set to the common voltage Vcom via the resistive element R3. The node ND2 is set to the reference voltage Vref via the resistive element R2. The node ND4 is set to the common voltage Vcom via the resistive element R4. Here, the node ND1 may be set to the reference voltage Vref and the node ND2 may be set to the bias voltage BIAS. Here, the reference voltage Vref may be set to the ground voltage GND.

The capacitive element C1 and the resistive element R3 function as a high-pass filter, remove a low-frequency component of a voltage signal transmitted to the node ND1, and transmit a high-frequency component to the input of the amplifier AMP1. The capacitive element C2 and the resistive element R4 function as a high-pass filter, remove a low-frequency component of a voltage signal transmitted to the node ND2, and transmit a high-frequency component to the input of the amplifier AMP2. Here, the circuit section 120 does not necessarily include the capacitive elements C1 and C2 and the resistive elements R3 and R4. In this case, the node ND1 may be connected to the input of the amplifier AMP1, and the node ND2 may be connected to the input of the amplifier AMP2.

The bias generation circuit 121 operates in synchronization with a clock signal CLK and generates the bias voltage BIAS. The bias voltage BIAS is supplied to the fixed electrode BP' via the terminal T2. The bias generation circuit 121 outputs, to the ½ bias generation circuit 122, a voltage V1 obtained in the process of generating the bias voltage BIAS.

The ½ bias generation circuit 122 generates a bias voltage ½BIAS having a half value of the bias voltage BIAS based on the voltage V1 received from the bias generation circuit 121. The bias voltage ½BIAS is supplied to the diaphragm VP via the terminal T1.

The bias generation circuit 121 is an example of a first bias generation circuit, and the bias voltage BIAS is an example of a first bias voltage. The ½ bias generation circuit 122 is an example of a second bias generation circuit, and the bias voltage ½BIAS is an example of a second bias voltage.

Figure 5:
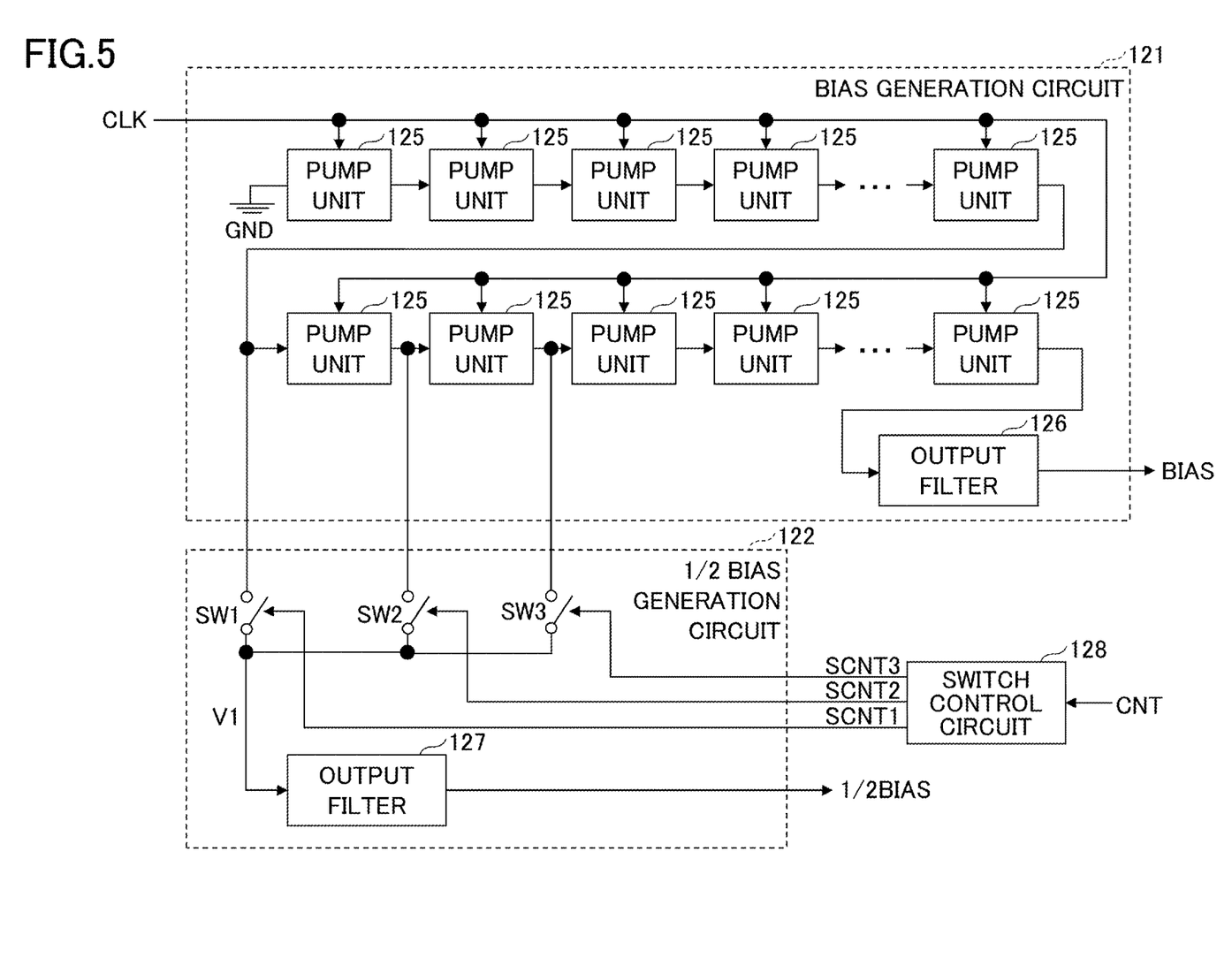
FIG. 5 is a circuit block diagram illustrating an example of a bias generation circuit and a ½ bias generation circuit in FIG. 1.

The bias voltage ½BIAS is set such that the difference between the bias voltage ½BIAS and the reference voltage Vref is approximately half of the difference between the bias voltage BIAS and the reference voltage Vref. Preferably, the difference between the bias voltage ½BIAS and the reference voltage Vref is half of the difference between the bias voltage BIAS and the reference voltage Vref. Thus, for example, a positive voltage and a negative voltage, having absolute values equal to each other with respect to the diaphragm VP, are respectively applied to the variable capacitors VC1 and VC2. Examples of the bias generation circuit 121 and the ½ bias generation circuit 122 are illustrated in FIG. 5.

As described above, the microphone 100 can respectively apply the positive voltage and the negative voltage to the variable capacitors VC1 and VC2 by using the bias voltages BIAS and ½BIAS, which are positive voltages. Because it is not necessary to mount the negative voltage generation circuit in the microphone 100, an increase in the circuit scale of the microphone 100 can be suppressed, and an increase in the cost of the microphone 100 can be suppressed.

The amplifier AMP1 receives a positive power supply voltage +Vlim and a negative power supply voltage −Vlim to operate, amplifies the voltage of the node ND3, and outputs the amplified voltage as an output voltage VP1. The amplifier AMP2 receives the positive power supply voltage +Vlim and the negative power supply voltage −Vlim to operate, amplifies the voltage of the node ND4, and outputs the amplified voltage as an output voltage VN1. For example, the positive supply voltage +Vlim is 2V and the negative supply voltage −Vlim is 0 V. Here, the amplifiers AMP1 and AMP2 may operate as buffers. In this case, the AMP1 directly outputs the voltage of the node ND3 as the output voltage VP1, and the amplifier AMP2 directly outputs the voltage of the node ND4 as the output voltage VN1.

The amplifier AMP1 is an example of a first voltage output section that outputs the output voltage VP1 that is changed in accordance with a change in the capacitance of the variable capacitor VC1. The amplifier AMP2 is an example of a second voltage output section that outputs the output voltage VN1 that is changed in accordance with a change in the capacitance of the variable capacitor VC2. The output voltage VP1 is an example of a first voltage, and the output voltage VN1 is an example of a second voltage.

For example, in the MEMS section 110, when the diaphragm VP vibrates due to the sound pressure and the facing distances between the diaphragm VP and the fixed electrodes BP1 and BP2 decrease, the capacitance values of the variable capacitors VC1 and VC2 increase. Thereby, the voltage of the node ND1 transiently decreases, and the voltage of the node ND3 also transiently decreases via the capacitive element C1. The amplifier AMP1 decreases the output voltage VP1 in accordance with the decrease in the voltage of the node ND3. Conversely, the voltage of the node ND2 transiently increases, and the voltage of the node ND4 also transiently increases via the capacitive element C2. The amplifier AMP2 increases the output voltage VP1 in accordance with the increase in the voltage of the node ND4.

With respect to the above, when the diaphragm VP vibrates due to the sound pressure and the facing distances between the diaphragm VP and the fixed electrodes BP1 and BP2 increase, the capacitance values of the variable capacitors VC1 and VC2 decrease. Thereby, the voltage of the node ND1 transiently increases, and the voltage of the node ND3 also transiently increases via the capacitive element C1. The amplifier AMP1 increases the output voltage VP1 in accordance with the increase in the voltage of the node ND3. Conversely, the voltage of the node ND2 transiently decreases, and the voltage of the node ND4 also transiently decreases via the capacitive element C2. The amplifier AMP2 decreases the output voltage VN1 in accordance with the decrease in the voltage of the node ND4.

Figure 2:
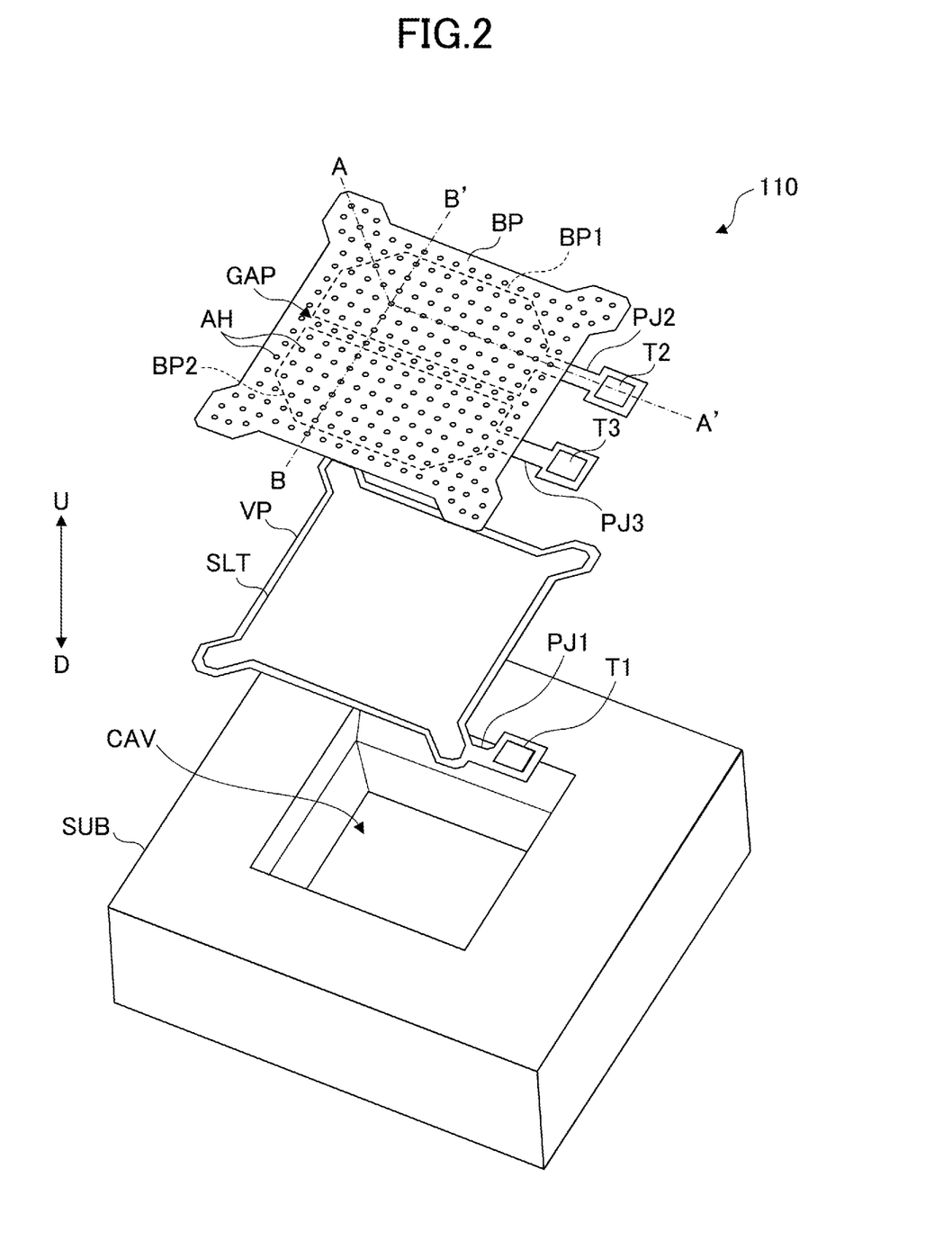
FIG. 2 is an exploded perspective view illustrating an example of a structure of a MEMS section in FIG. 1.

FIG. 2 is an exploded perspective view illustrating an example of a structure of the MEMS section 110 illustrated in FIG. 1. In the following, the upward direction of the exploded perspective view is referred to as an upper side U and the downward direction of the perspective view is referred to as a lower side D. The MEMS section 110 includes a substrate SUB in which a cavity CAV that is a through-hole penetrating from the upper side U to the lower side D is formed.

For example, the substrate SUB is formed by processing a semiconductor substrate of single crystal silicon or the like. For example, the MEMS section 110 is formed as described below. First, the diaphragm VP, the fixed electrodes BP1 and BP2, the back plate BP, and the terminals T1, T2, and T3 are sequentially formed on a silicon wafer. Next, the cavity CAV is formed at a position facing the diaphragm VP in the silicon wafer, and the MEMS section 110 is formed by dicing the silicon wafer. The substrate SUB of each MEMS section 110 is formed in a cuboid shape by dicing. As described, the MEMS section 110 is manufactured using a semiconductor manufacturing technique. Here, the order in which the elements of the MEMS section 110 are formed is not limited to the order described above.

The diaphragm VP is disposed on the upper side U of the cavity CAV at a position where the diaphragm VP covers the cavity CAV. The diaphragm VP has, for example, a substantially rectangular shape, and the entirety or part of the periphery of the diaphragm VP is fixed to the substrate SUB. For example, in the outer periphery of the diaphragm VP, an annular slit SLT is formed along the outer periphery. One of the four corners of the diaphragm has a projecting portion PJ1. The terminal T1 illustrated in FIG. 1 is provided on the upper side U and on the tip end side of the projecting portion PJ1. Here, the positions at which the projecting portion PJ1 and the terminal T1 are formed are not limited to the example illustrated in FIG. 2. Additionally, the shape of the diaphragm VP is not limited to a rectangular shape, but another shape, such as a circular shape, a triangular shape, or the like, may be adopted.

The fixed electrodes BP1 and BP2 are disposed in the upper side U direction from the diaphragm VP and are opposite to the diaphragm VP. The fixed electrodes BP1 and BP2 have, for example, a rectangular plate shape elongated toward the terminals T2 and T3, and are arranged side by side with the gap GAP interposed therebetween. Here, the shapes of the fixed electrodes BP1 and BP2 are not limited as long as the areas thereof are equal to each other, and the fixed electrodes BP1 and BP2 may have a shape other than a rectangular shape.

The upper side U of the fixed electrodes BP1 and BP2 is fixed to the back plate BP that fixes the fixed electrodes BP1 and BP2 to the substrate SUB. That is, the fixed electrodes BP1 and BP2 are disposed on the back plate BP on the side closer to the diaphragm VP. The back plate BP has, for example, a substantially rectangular shape and has an electrical insulation property. The periphery of the back plate BP is fixed to the substrate SUB. The back plate BP is an example of a fixing plate to which the fixed electrodes BP1 and BP2 are fixed. Here, the shape of the back plate BP is not limited to a rectangular shape, but another shape, such as a circular shape, a triangular shape, or the like, may be adopted. Additionally, the back plates BP may be respectively disposed on the upper side U and the lower side D of the fixed electrodes BP1 and BP2, and the fixed electrodes BP1 and BP2 may be sandwiched between the back plates BP.

By disposing the fixed electrodes BP1 and BP2 on the back plate BP on the side closer to the diaphragm VP (on the lower side D), the facing distance with respect to the diaphragm VP can be reduced in comparison with the case where the fixed electrodes BP1 and BP2 are disposed on the back plate BP on a side opposite to the side closer to the diaphragm VP (on the upper side U). The capacitance of the variable capacitors VC1 and VC2 can be increased by reducing the facing distance between the diaphragm VP and the fixed electrodes BP1 and BP2 and the diaphragm VP, and the detection sensitivity of the sound pressure can be improved. As a result, the performance of the microphone 100 can be improved.

The fixed electrode BP1 has a projecting portion PJ2 projecting from the periphery of the back plate BP. The terminal T2 is provided on the upper side U and on the tip end side of the projecting portion PJ2. Similarly, the fixed electrode BP2 has a projecting portion PJ3 projecting from the periphery of the back plate BP. The terminal T3 is provided on the upper side U and on the tip end side of the projecting portion PJ3. The positions where the projecting portions PJ2 and PJ3 and the terminals T2 and T3 are formed are not limited to the example illustrated in FIG. 2.

Further, the fixed electrodes BP1 and BP2 and the back plate BP have multiple acoustic holes AH penetrating through the fixed electrodes BP1 and BP2 and the back plate BP. The number, the size, the formation interval, and the arrangement shape of the acoustic holes AH are not limited to the example illustrated in FIG. 2.

Here, the fixed electrodes BP1 and BP2 may have different shapes as long as the areas of the conductive surfaces are equal to each other. It is preferable that the same number of acoustic holes AH are formed in the fixed electrodes BP1 and BP2 in order to make the areas of the conductive surfaces equal to each other.

Although not particularly limited, for example, the diaphragm VP and the fixed electrodes BP1 and BP2 are formed of polysilicon, and the back plate BP is formed of silicon nitride (SiN). For example, the terminals T1, T2, and T3 are formed of gold (Au).

Figure 3:
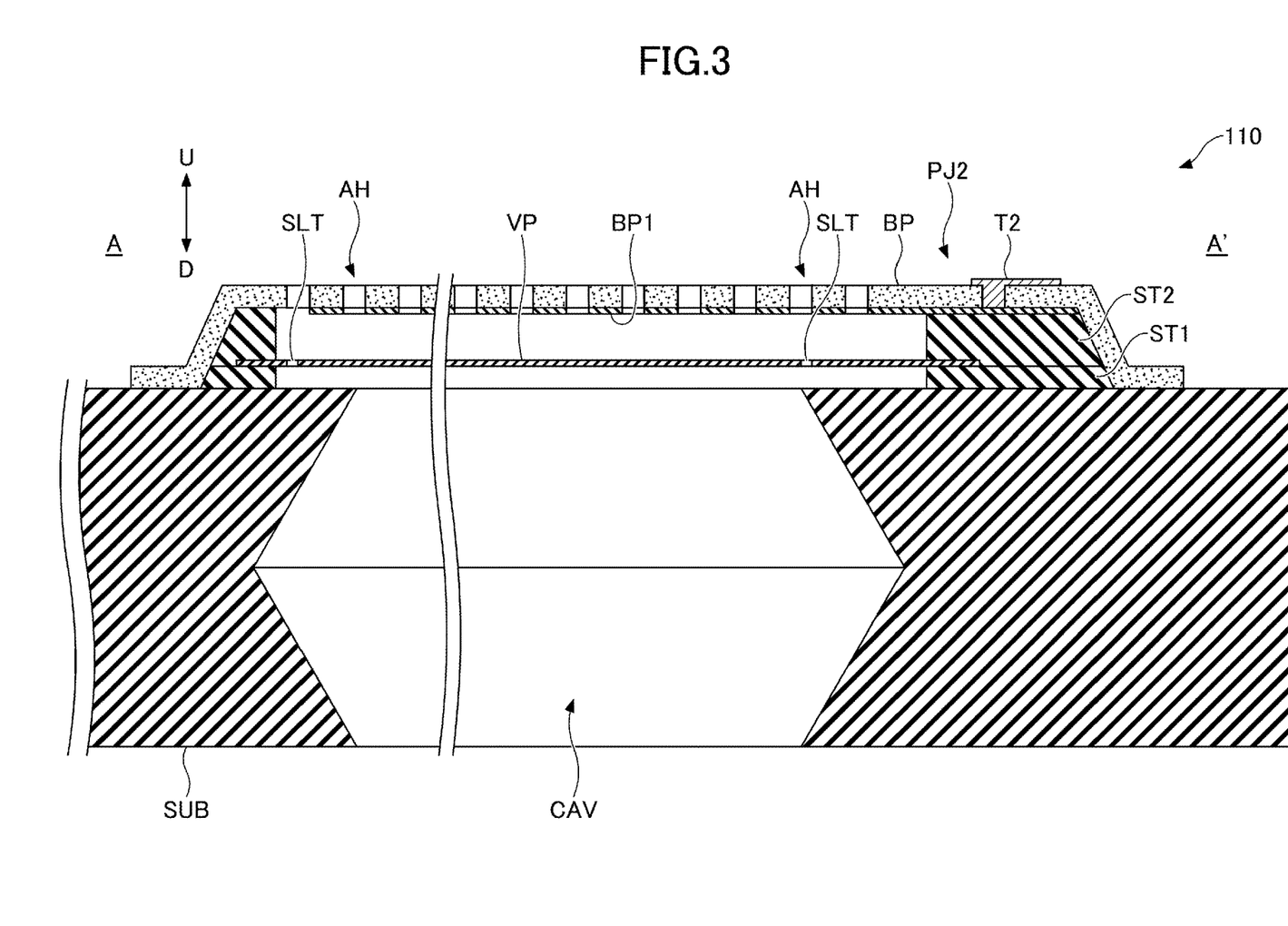
FIG. 3 is a cross-sectional view taken along the line A-A' of FIG. 2.

FIG. 3 is a cross-sectional view taken along the line A-A' of FIG. 2. Here, the line A-A' of the diaphragm VP and the substrate SUB is located at a position where the line A-A' of the back plate BP in FIG. 2 is translated to the lower side D.

Four corners of the diaphragm VP are fixed on a support base ST1 formed in an annular shape on the substrate SUB. The back plate BP is formed to cover a support base ST2 provided on the support base ST1. For example, the support bases ST1 and ST2 are formed of silicon dioxide (SiO$_2$). Although the diaphragm VP is fixed on the support base ST1, the diaphragm VP may be directly formed and fixed on the back plate BP or the substrate SUB, or may be formed on another laminated film formed on the substrate SUB. Additionally, the fixing positions are not limited to the four corners, and the entire periphery, two sides, the center, or the like may be fixed. Additionally, the back plate BP may be directly formed on the support base ST1, the support base ST2, or the substrate SUB, and the formation position is not limited.

The fixed electrode BP1 is in contact with the lower side D of the back plate BP and is supported by the back plate BP. A through-hole penetrating the back plate BP to reach the fixed electrode BP1 is formed in the back plate BP on the projecting portion PJ2 side. The terminal T2 is formed by embedding a conductive member in the through-hole. The cross-sectional structure of the fixed electrode BP2 and the terminal T3 are also substantially the same as those illustrated in FIG. 3.

Figure 4:
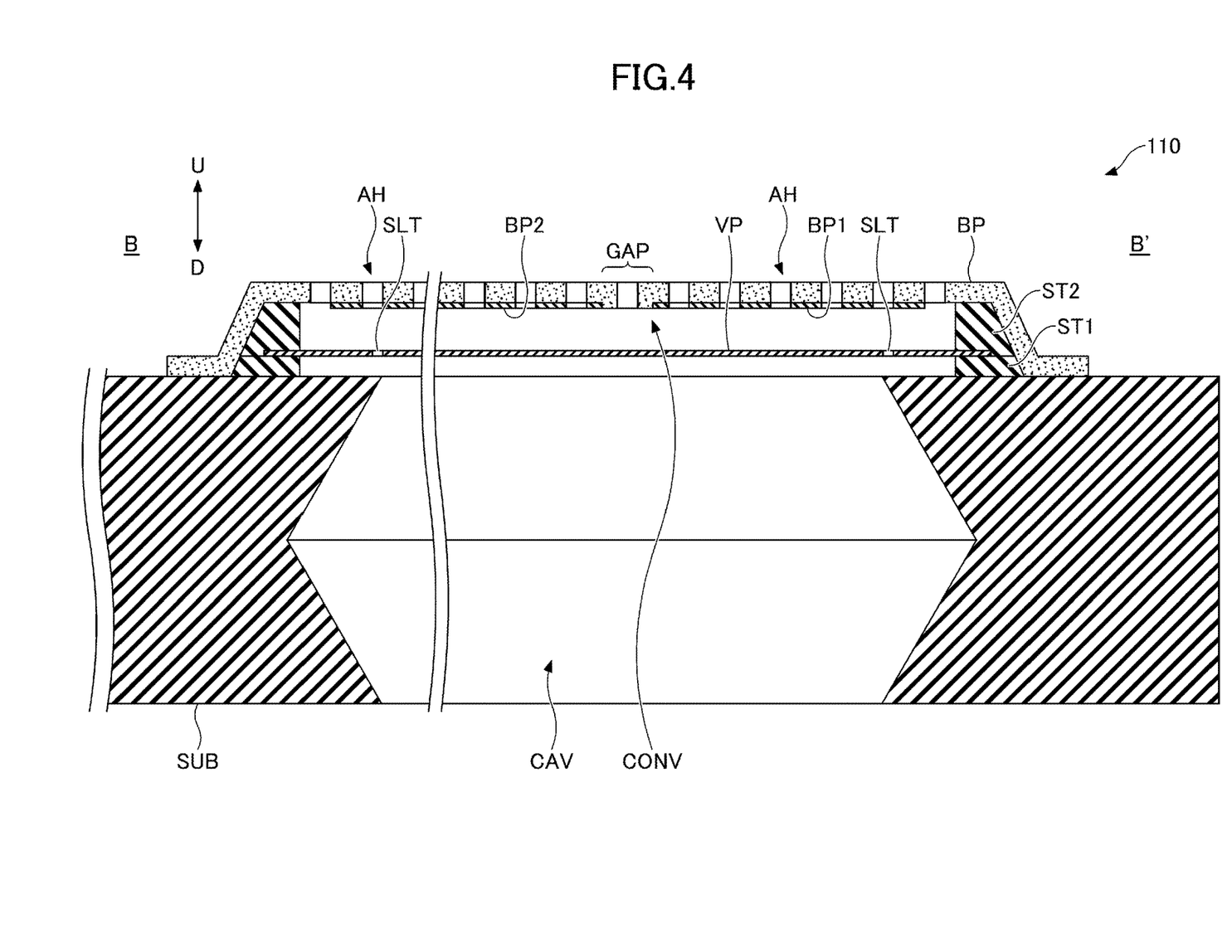
FIG. 4 is a cross-sectional view taken along the line B-B' of FIG. 2.

FIG. 4 is a cross-sectional view taken along the line B-B' of FIG. 2. A detailed description of the structure the same as the structure in FIG. 3 is omitted. The line B-B' of the diaphragm VP and the substrate SUB is located at a position where the line B-B' of the back plate BP in FIG. 2 is translated to the lower side D.

The fixed electrodes BP1 and BP2 are disposed on the lower side D of the back plate BP, and the facing distances to the diaphragm VP are equal to each other. By disposing the fixed electrodes BP1 and BP2 on the same side (the lower side D in FIG. 4) with respect to the back plate BP, the facing distances to the diaphragm VP can be automatically made equal with high accuracy when forming the fixed electrodes BP1 and BP2 in the manufacturing process of the MEMS section 110.

Additionally, because the fixed electrodes BP1 and BP2 are formed at positions close to each other by using the common polysilicon layer, the areas of the fixed electrodes BP1 and BP2 can be easily made equal to each other by corresponding the areas of the fixed electrodes BP1 and BP2 to the areas of the photo mask of the polysilicon layer. As described above, by forming the fixed electrodes BP1 and BP2 in the MEMS section 110 by using a semiconductor manufacturing technique, the areas of the fixed electrodes BP1 and BP2 and the facing distances between the fixed electrodes BP1 and BP2 and the diaphragm VP can be made equal to each other with high accuracy. Therefore, the capacitances of the variable capacitors VC1 and VC2 can be made equal to each other with high accuracy. As a result, the microphone 100 can output, from the amplifiers AMP1 and AMP2, the differential output signals VP1 and VN1, the phases of which are inverted to each other.

With respect to the above, for example, when the fixed electrodes BP1 and BP2 are respectively formed on two back plates provided over and under the diaphragm VP so as to respectively face the upper side U and the lower side D of the diaphragm VP, the fixed electrodes BP1 and BP2 are formed using different polysilicon layers. Therefore, it is difficult to make the capacitances of the variable capacitors VC1 and VC2 equal to each other with high accuracy, and it is difficult to output, from the amplifiers AMP1 and AMP2, the differential output signals VP1 and VN1, the phases of which are inverted to each other.

Additionally, for example, in an electret condenser microphone (ECM) in which components, such as a variable capacitor formed by a metal plate and a spacer and an amplifier, are mounted on a printed circuit board, it is difficult to make the capacitances of the two variable capacitors equal to each other with high accuracy. Therefore, it is difficult to output, from the amplifiers, differential output signals, the phases of which are inverted to each other.

In a gap GAP that is a portion adjacent to the fixed electrodes BP1 and BP2 formed side by side over the diaphragm VP, a protrusion CONV filling the gap GAP is formed toward the diaphragm VP. The protrusion CONV is formed integrally with the back plate BP and has an electrical insulation property. By forming the protrusion CONV having an electrical insulation property so as to block the portion adjacent to the fixed electrodes BP1 and BP2, the fixed electrodes BP1 and BP2 can be electrically separated with certainty. Here, in FIG. 4, the acoustic hole AH is formed in the gap GAP so that the diaphragm VP easily vibrates in response to the sound pressure. However, the acoustic hole AH is not necessarily formed in the gap GAP.

FIG. 5 is a circuit block diagram illustrating an example of the bias generation circuit 121 and the ½ bias generation circuit 122 in FIG. 1. The bias generation circuit 121 includes multiple pump units 125 connected in series and an output filter 126. The pump unit 125 is an example of a charge pump circuit. The ½ bias generation circuit 122 includes multiple switches SW (SW1, SW2, SW3) and an output filter 127.

In the bias generation circuit 121, each pump unit 125 performs a pump operation in synchronization with the clock signal CLK, raises a voltage received from a previous stage, and outputs the raised voltage to a subsequent stage. The bias generation circuit 121 generates the bias voltage BIAS according to the number of stages of the pump units 125 and the voltage amplitude of the clock signal CLK. Here, in FIG. 5, although the pump unit 125 at the first stage receives the ground voltage GND as an input, the pump unit 125 at the first stage may receive the reference voltage Vref as an input.

The output filter 126 has a function of a low-pass filter that removes a high-frequency component included in the voltage output from the pump unit 125 at the final stage and outputs the voltage as the bias voltage BIAS. The raised voltage supplied to the output filter 126 includes a high-frequency component but is equal to the bias voltage BIAS. Here, the pump unit 125 that outputs the raised voltage to the output filter 126 is not limited to the pump unit 125 at the final stage, and may be any one of the pump units 125 on the rear stage side.

The ½ bias generation circuit 122 receives the multiple raised voltages output from the multiple pump units 125 located on the front stage side with respect to the pump units 125 on the rear stage side in the bias generation circuit 121 at the switches SW (SW1 to SW3). One of the switches SW1 to SW3 is turned on to transmit the voltage received from bias generation circuit 121 to the output filter 127 as the voltage V1.

The output filter 127 has a function of a low pass filter that removes a high-frequency component included in the voltage V1 received from one of the switches SW and outputs the voltage as the bias voltage ½BIAS. The voltage V1 supplied to the output filter 127 includes a high-frequency component, but is equal to the bias voltage ½BIAS.

Each switch SW (SW1 to SW3) operates in accordance with, for example, a switch control signal SCNT (SCNT1 to SCNT3) generated by a switch control circuit 128. The switch control circuit 128 sets one of the switch control signals SCNT1 and SCNT3 to a valid level and sets the others to an invalid level in accordance with the control signal CNT or the control voltage CNT.

Then, among the multiple switches SW (SW1 to SW3), the switch SW that receives the switch control signal SCNT set to the valid level is turned on, and one of the outputs of the pump units 125 is connected to the input of the output filter 127. Which of the switch control signals SCNT1 and SCNT3 is set to the valid level by the switch control circuit 128 is determined by, for example, an operation test of the circuit section 120 in FIG. 1.

Thereby, the ½ bias generation circuit 122 can generate the bias voltage ½BIAS whose difference from the reference voltage Vref is half of the difference between the bias voltage BIAS and the reference voltage Vref by using the voltage V1, which is obtained in the process of the bias generation circuit 121 generating the bias voltage BIAS. As a result, the bias voltage ½BIAS can be generated without forming the pump unit 125 in the ½ bias generation circuit 122, and an increase in the circuit scale of the circuits that generate the bias voltages BIAS and ½BIAS can be suppressed.

Here, the switch control circuit 128 may include a program circuit such as a fuse circuit that is programmed based on the operation test of the circuit section 120. In this case, one of the switch control signals SCNT1 to SCNT3 is set to a valid level in accordance with a program state of the program circuit.

Additionally, the number of switches SW is not limited to three. Furthermore, the ½ bias generation circuit 122 does not necessarily include the switch SW, and for example, the voltage output from an n/2-th pump unit 125 among n (an even number) pump units 125 included in the bias generation circuit 121 may be received by the output filter 127. Here, an odd number of pump units 125 can be provided by, for example, changing and adjusting the amplitudes of the clock signals CLK in the front stage and the rear stage of the pump units 125.

Additionally, the bias generation circuit 121 may include multiple switches that selectively connect the outputs of a predetermined number of pump units 125 on the rear stage side to the inputs of the output filter 126. Thereby, the value of the bias voltage BIAS can be finely adjusted.

Figure 6:
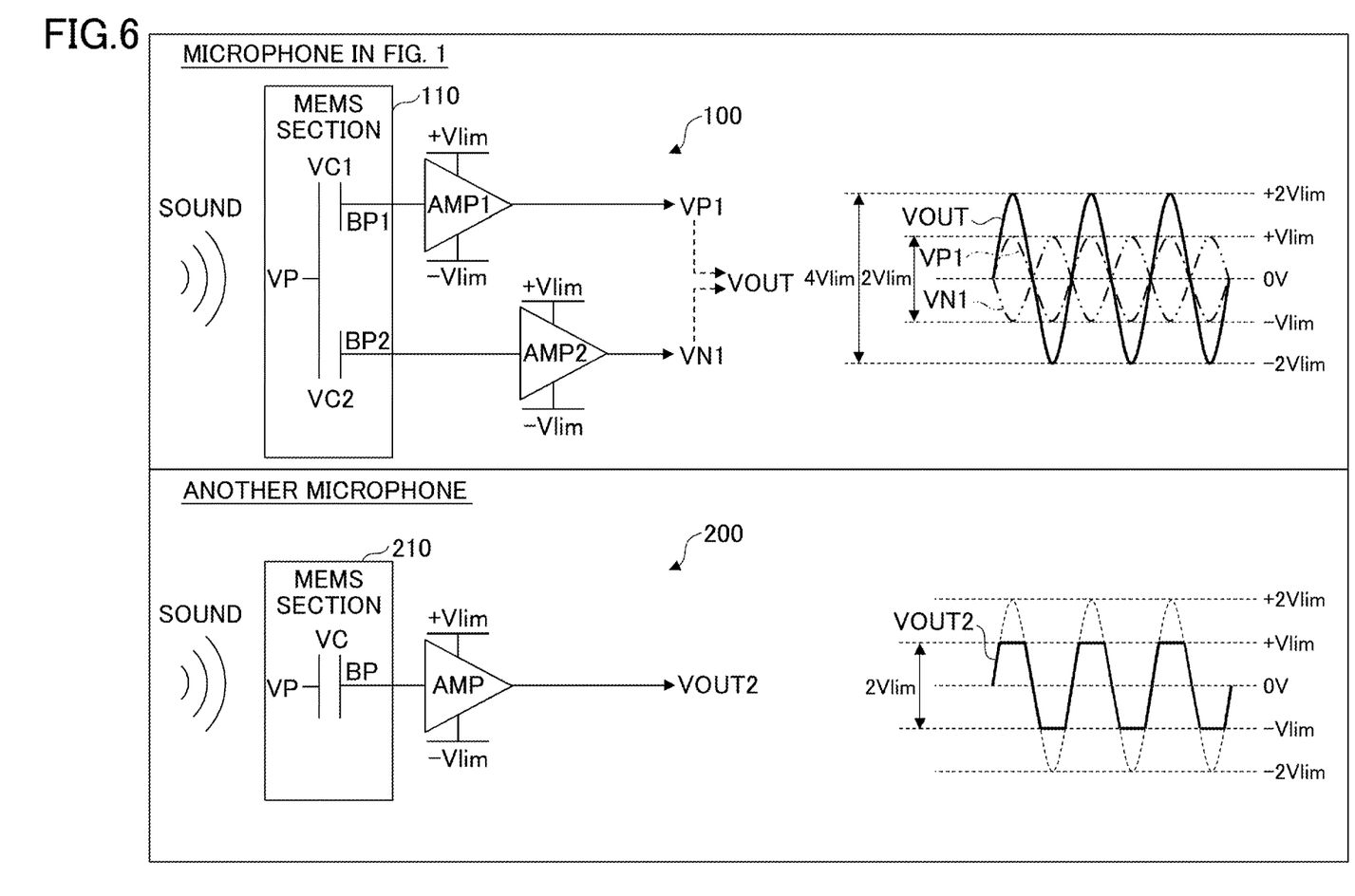
FIG. 6 is an explanatory diagram illustrating an example of an output signal output from the microphone in FIG. 1 and an output signal output from another microphone in which the fixed electrode is not divided.

FIG. 6 is an explanatory diagram illustrating an example of an output signal output from the microphone 100 in FIG. 1 and an output signal output from another microphone in which the fixed electrode is not divided. The microphone 100 illustrated in FIG. 1 outputs, from the amplifiers AMP1 and AMP2, the differential output signals VP1 and VN1, the phases of which are inverted to each other. The maximum amplitude of the output signals VP1 and VN1 is 2 Vlim.

The phases of the output signals VP1 and VN1 are inverted to each other. Thus, an external circuit that receives the output signals VP1 and VN1 from the microphone 100 can handle the output signals VP1 and VN1 as differential signals. Therefore, for example, when the voltage difference between the output signals VP1 and VN1 is an output signal VOUT, the external circuit can generate the output signal VOUT having the maximum amplitude of 4 Vlim, which is twice the maximum amplitude of each of the output signals VP1 and VN1. That is, the external circuit can generate the output signal VOUT that is not distorted from the voltage −2 Vlim to the voltage +2 Vlim.

With respect to the above, in the microphone 200 having the variable capacitor VC including the single fixed electrodes BP, the maximum amplitude of an output signal VOUT2 output from the single amplifier AMP is 2 Vlim. The maximum voltage and the minimum voltage that can be output by the amplifier AMP are respectively limited to +Vlim and −Vlim.

Therefore, the maximum level of the input sound pressure at which the microphone 200 can output the output signal VOUT2 without distortion is half the maximum level of the input sound pressure at which the output signal VOUT can be output without distortion based on the output signals VP1 and VN1. For example, when the upper limit and the lower limit of the output signal VOUT2 are clamped to the voltage +Vlim and the voltage −Vlim, respectively, by the sound pressure input to the microphone 200, distortion occurs in the output signal VOUT2.

As illustrated in FIG. 2, by forming the diaphragm VP and the fixed electrodes BP1 and BP2 using the MEMS technology, the capacitances of the variable capacitors VC1 and VC2 can be made equal to each other with high accuracy. The amounts of changes in the capacitances of the variable capacitors VC1 and VC2 when the diaphragm VP vibrates can be made equal to each other with high accuracy. Therefore, for example, the voltage difference between the output signals VP1 and VN1, the phases of which are inverted to each other, can generate an output signal having an amplitude substantially twice the amplitude of the output signals VP1 and VN1.

As described above, in the ECM in which components such as the variable capacitor formed by the metal plate and the spacer, the amplifier, and the like are mounted on the printed circuit board, it is difficult to make the capacitances of the two variable capacitors equal to each other with high accuracy. Therefore, it is difficult to make the amounts of changes in the capacitances of the two variable capacitors equal to each other when the diaphragm vibrates, and it is difficult to make the amplitude of the voltage difference between the output signals output from the two amplifiers twice the amplitude of the output signal of each amplifier.

Figure 7:
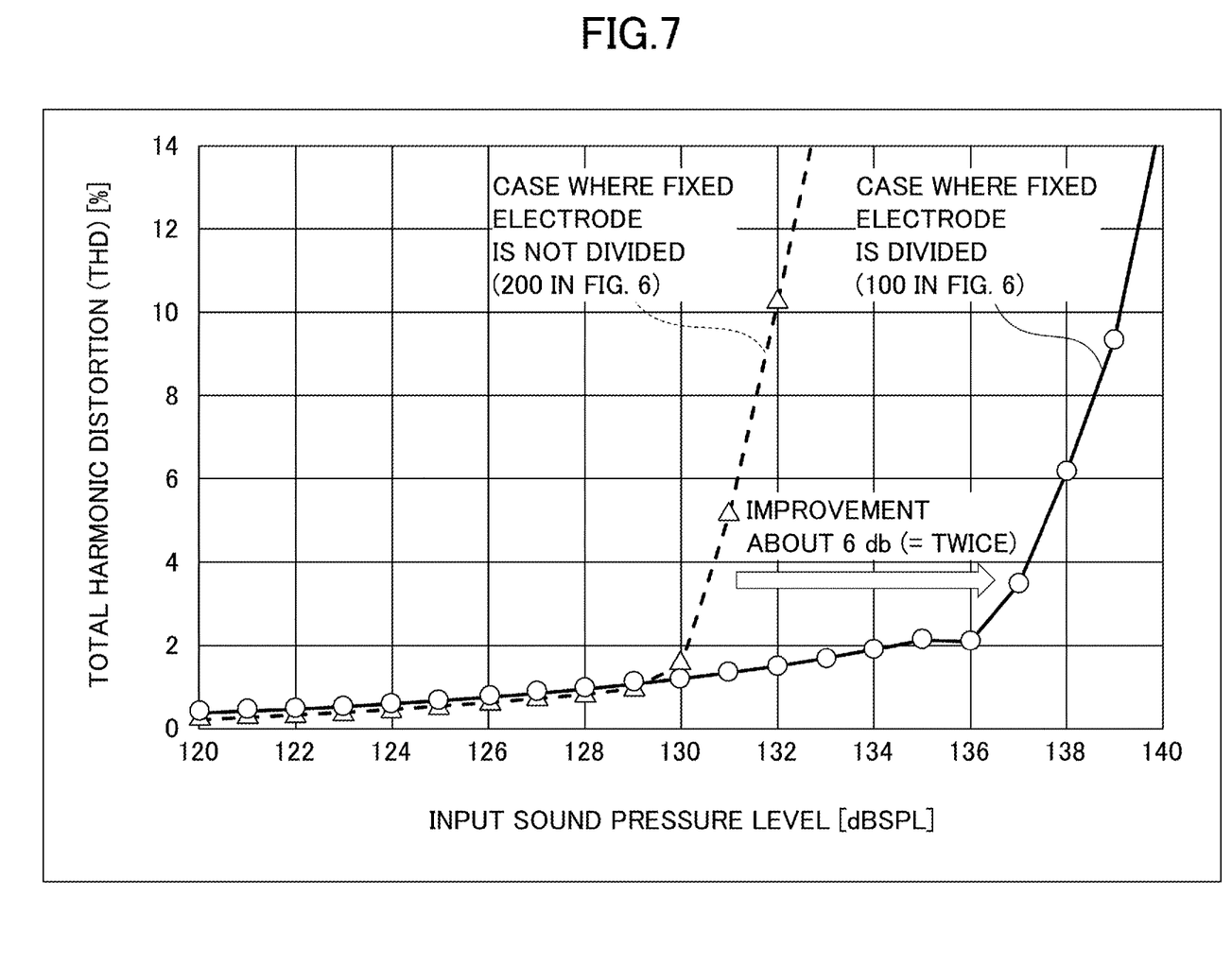
FIG. 7 is an explanatory diagram illustrating an example of a result of a simulation for evaluating total harmonic distortion of a microphone in a case where the fixed electrode is divided and in a case where the fixed electrode is not divided.

FIG. 7 is an explanatory diagram illustrating an example of a result of a simulation for evaluating total harmonic distortion (THD) of the microphone in a case where the fixed electrode is divided and in a case where the fixed electrode is not divided.

The simulation was performed using the microphone 100 illustrated in FIG. 1 and the microphone 200 illustrated in FIG. 6. In the simulation of the microphone 100, the voltage difference between the output signals VP1 and VN1 is regarded as the output signal VOUT. The microphone 200 includes a MEMS section 210 including the fixed electrode BP that is not divided and an amplifier AMP having an input connected to the fixed electrode BP and outputting the output signal VOUT2.

The simulation result illustrated in FIG. 7 indicates the total harmonic distortion THD with respect to the output signal VOUT for the sound pressure level input to the microphone 100 and the output signal VOUT2 for the sound pressure level input to the microphone 200. As a result of the simulation, it is found that the sound pressure level that can be input to the microphone 100 without distortion of the output signal VOUT can be increased by about 6 dB (=twice) in comparison with the sound pressure level that can be input to the microphone 200 without distortion of the output signal VOUT2. That is, the microphone 100 having the fixed electrodes BP1 and BP2 that are divided can output the output signals without distortion for a wider range of the sound pressure than the microphone 200 having the fixed electrode BP that is not divided.

As described above, in the first embodiment, the microphone 100 can respectively apply the positive voltage and the negative voltage to the variable capacitors VC1 and VC2 by using the bias voltages BIAS and ½BIAS, which are positive voltages. Because the negative voltage generation circuit does not need to be mounted in the microphone 100, an increase in the circuit scale of the microphone 100 can be suppressed, and an increase in the cost of the microphone 100 can be suppressed.

Additionally, in the variable capacitors VC1 and VC2, the fixed electrodes BP1 and BP2 formed in the same layer are formed to have the identical area, and the facing distances between the fixed electrodes BP1 and BP2 and the diaphragm VP are set to be equal to each other. Thereby, the capacitances of the variable capacitors VC1 and VC2 can be made equal to each other, and the output signals VP1 and VN1, which are differential signals whose phases are inverted to each other, can be generated with high accuracy. As a result, the output signals VP1 and VN1, which are differential signals whose phases are inverted to each other, can be generated while an increase in the circuit scale of the microphone 100 is suppressed.

The ½ bias generation circuit 122 can generate the bias voltage ½BIAS whose difference from the reference voltage Vref is about half of the difference between the bias voltage BIAS and the reference voltage Vref by using the voltage V1 obtained in the process of the bias generation circuit 121 generating the bias voltage BIAS. As a result, the bias voltage ½BIAS can be generated without forming the pump unit 125 in the ½ bias generation circuit 122, and an increase in the circuit scale of the circuit that generates the bias voltages BIAS and ½BIAS can be suppressed.

By disposing the fixed electrodes BP1 and BP2 on the back plate BP on a side closer to the diaphragm VP, the facing distance with respect to the diaphragm VP can be reduced in comparison with the case where the fixed electrodes BP1 and BP2 are disposed on the back plate BP on a side opposite to the side closer to the diaphragm VP. Thereby, the capacitances of the variable capacitors VC1 and VC2 can be increased, and the sound pressure detection sensitivity can be improved. As a result, the performance of the microphone 100 can be improved.

By forming the protrusion CONV having an electrical insulation property so as to block the portion adjacent to the fixed electrodes BP1 and BP2, the fixed electrodes BP1 and BP2 can be electrically separated with certainty. At this time, by forming the protrusion CONV integrally with the back plate BP, the protrusion CONV can be self-aligned.

By forming the MEMS section 110 on the substrate SUB by using a semiconductor manufacturing technique, the areas of the fixed electrodes BP1 and BP2 and the facing distances between the fixed electrodes BP1 and BP2 and the diaphragm VP can be made equal with high accuracy.

Figure 8:
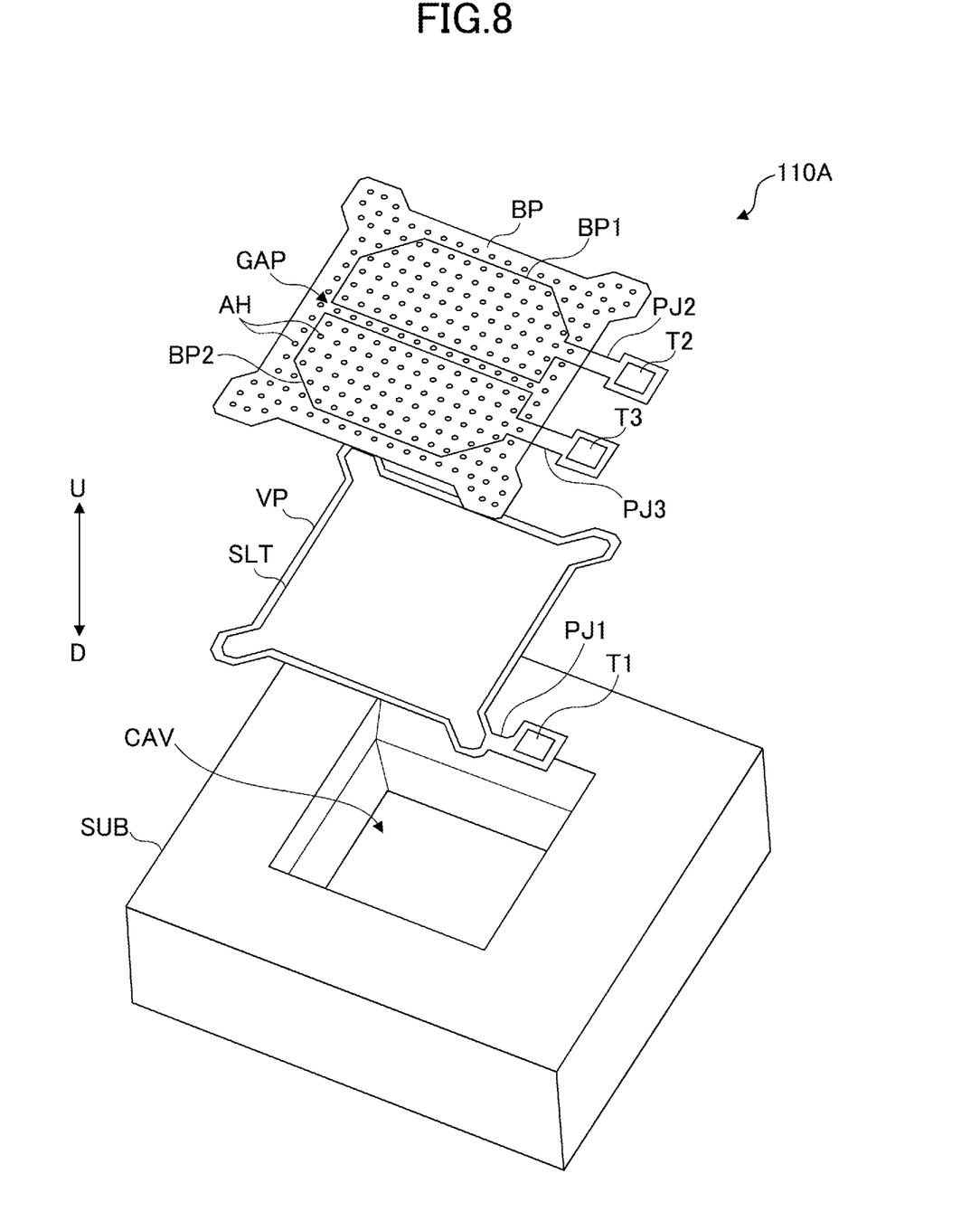
FIG. 8 is an exploded perspective view illustrating an example of a structure of a MEMS section of a microphone according to a second embodiment.

FIG. 8 is an exploded perspective view illustrating an example of a structure of a MEMS section of a microphone according to a second embodiment. The components the same as those of the first embodiment are denoted by the same reference symbols, and a detailed description thereof will be omitted.

A MEMS section 110A illustrated in FIG. 8 has a structure substantially the same as the MEMS section 110 illustrated in FIG. 2 except that the fixed electrodes BP1 and BP2 are formed on the upper side U of the back plate BP. For example, the fixed electrodes BP1 and BP2 are formed using a polysilicon layer of the back plate BP on the upper side U. Because the fixed electrodes BP1 and BP2 are formed on the upper side U of the back plate BP, the cross-sectional structure of the terminals T2 and T3 is different from the cross-sectional structure illustrated in FIG. 3. For example, the terminals T2 and T3 are directly formed on the fixed electrodes BP1 and BP2, respectively.

The microphone of the second embodiment has a configuration substantially the same as that of the microphone 100 illustrated in FIG. 1 except that the MEMS section 110A is included instead of the MEMS section 110. That is, the microphone of the second embodiment includes the circuit section 120 that is connected to the MEMS section 110A and that outputs the output signals VP1 and VN1. Additionally, the simulation result of the total harmonic distortion THD of the microphone of the second embodiment is substantially the same as the simulation result of the microphone 100 in FIG. 7.

As described above, also in the second embodiment, the same or substantially the same effects as those of the first embodiment can be obtained. For example, because the positive voltage and the negative voltage can be respectively applied to the variable capacitors VC1 and VC2 without a negative voltage generation circuit being mounted on the microphone, an increase in the circuit scale and cost of the microphone can be suppressed. By forming the fixed electrodes BP1 and BP2 in the same layer, the capacitances of the variable capacitors VC1 and VC2 can be made equal to each other, and the output signals VP1 and VN1, which are differential signals whose phases are inverted to each other, can be accurately generated. As a result, the output signals VP1 and VN1, which are differential signals whose phases are inverted to each other, can be generated while an increase in the circuit scale of the microphone is suppressed.

Figure 9:
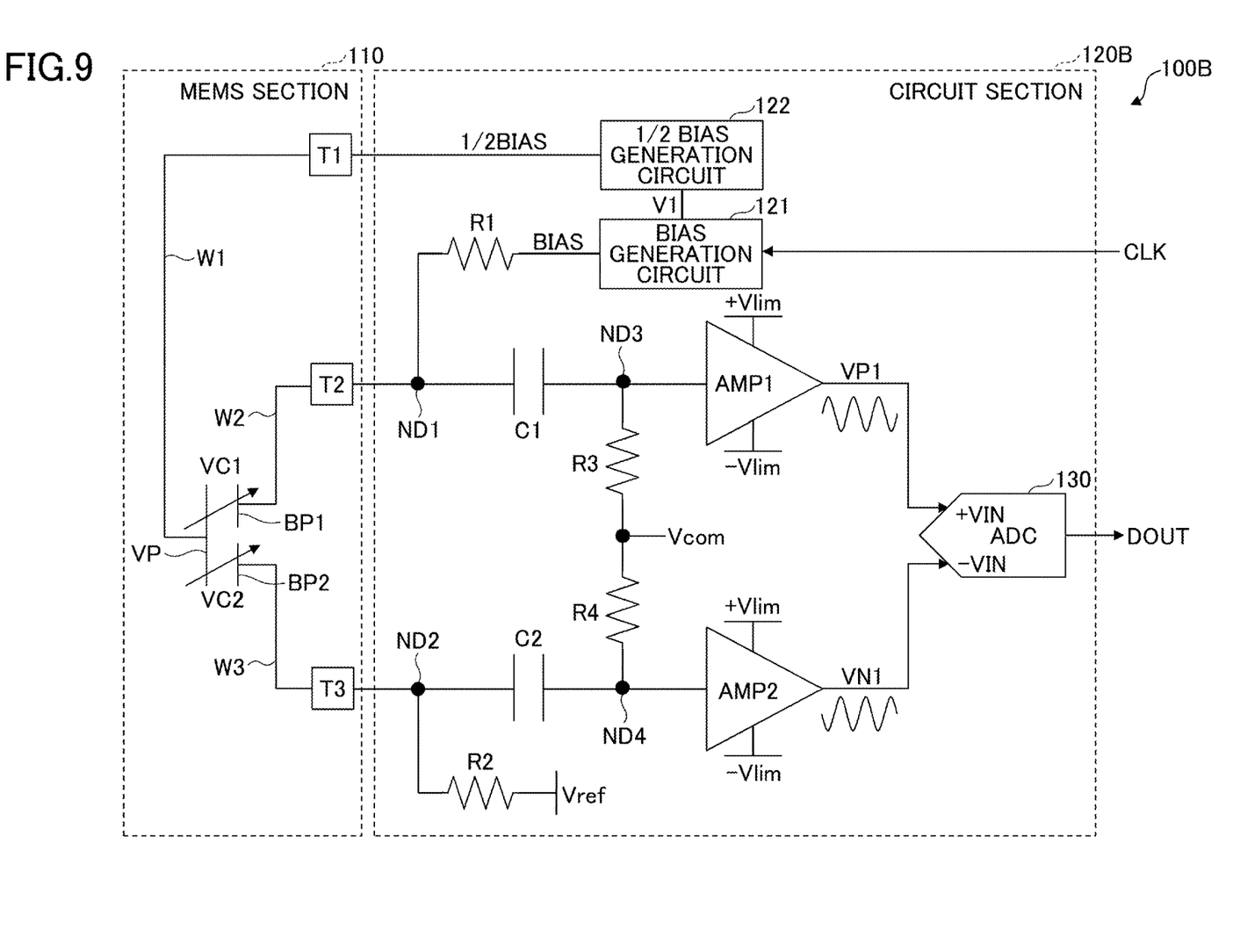
FIG. 9 is a block diagram illustrating an example of a microphone according to a third embodiment.

FIG. 9 is a block diagram illustrating an example of a microphone according to a third embodiment. The components the same as those of the first embodiment are denoted by the same reference symbols, and a detailed description thereof will be omitted. A microphone 100B of the third embodiment has a configuration substantially the same as that of the microphone 100 of FIG. 1 except that a circuit section 120B is included instead of the circuit section 120 of FIG. 1.

In the circuit section 120B, an analog-to-digital converter (ADC) 130 is added to the circuit section 120 in FIG. 1. The ADC 130 receives the output signal VP1 outputted from the amplifier AMP1 and the output signal VN1 output from the amplifier AMP2 at differential inputs +VIN and −VIN, and outputs a single-phase digital signal DOUT indicating a voltage difference between the differential inputs +VIN and −VIN.

The value of the digital output signal DOUT corresponds to the voltage value of the output signal VOUT illustrated in FIG. 6. That is, the simulation result of the total harmonic distortion THD of the microphone 100B of the third embodiment is substantially the same as the simulation result of the microphone 100 in FIG. 7. Here, the circuit section 120B may include a differential amplifier instead of the ADC 130 or may include two ADCs that respectively convert the output signals VP1 and VN1 into digital values. Additionally, the microphone 100B may include the MEMS section 110A illustrated in FIG. 8 instead of the MEMS section 110.

As described above, also in the third embodiment, effects the same or substantially the same as those of the first embodiment can be obtained. For example, because the positive voltage and the negative voltage can be respectively applied to the variable capacitors VC1 and VC2 without a negative voltage generation circuit being mounted in the microphone 100B, an increase in the circuit scale and the cost of the microphone 100B can be suppressed. By forming the fixed electrodes BP1 and BP2 in the same layer, the capacitances of the variable capacitors VC1 and VC2 can be made equal to each other, and the output signals VP1 and VN1, which are differential signals whose phases are inverted to each other, can be accurately generated. As a result, the output signals VP1 and VN1, which are differential signals whose phases are inverted to each other, can be generated while an increase in the circuit scale of the microphone 100B is suppressed.

Furthermore, in the third embodiment, the microphone 100B includes the ADC 130 that outputs a single-phase digital output signal DOUT indicating the voltage difference between the differential output signals VP1 and VN1. Thereby, the external circuit connected to the microphone 100B can be configured by a digital circuit, and the processing of the differential signal generated based on the change in the sound pressure can be simplified.

Although the embodiments of the present invention have been described in detail above, the present invention is not limited to the specific embodiments, and various modifications and improvements can be made without departing from the subject matter of the present invention.

What is claimed is:

1. A micro electro mechanical systems (MEMS) microphone comprising:
a diaphragm having conductivity;
a first variable capacitor including a first fixed electrode facing the diaphragm, a capacitance of the first variable capacitor being changed in accordance with a vibration of the diaphragm;
a second variable capacitor including a second fixed electrode facing the diaphragm, a capacitance of the second variable capacitor being changed in accordance with the vibration of the diaphragm;
a first voltage output section configured to output a first voltage that is changed in accordance with a change in the capacitance of the first variable capacitor; and
a second voltage output section configured to output a second voltage that is changed in accordance with a change in the capacitance of the second variable capacitor,
wherein a first bias voltage is applied to the first fixed electrode,
wherein a reference voltage is applied to the second fixed electrode, and
wherein a second bias voltage is applied to the diaphragm, a difference between the second bias voltage and the reference voltage being half of a difference between the first bias voltage and the reference voltage.

2. The MEMS microphone as claimed in claim 1, wherein an area of the first fixed electrode is equal to an area of the second fixed electrode, and a distance between the first fixed electrode and the diaphragm is equal to a distance between the second fixed electrode and the diaphragm.

3. The MEMS microphone as claimed in claim 1, wherein the second fixed electrode is connected to a ground wire.

4. The MEMS microphone as claimed in claim 1, further comprising:
a first bias generation circuit configured to generate the first bias voltage; and
a second bias generation circuit configured to generate the second bias voltage,
wherein the first bias generation circuit includes a plurality of charge pump circuits connected in series and is configured to output the first bias voltage from one charge pump circuit among the plurality of charge pump circuits, and
wherein the second bias generation circuit is configured to output a voltage output from a front stage circuit as the second bias voltage, the front stage circuit being one charge pump circuit among charge pump circuits located on a front stage side in the plurality of charge pump circuits.

5. The MEMS microphone as claimed in claim 1, further comprising a fixing plate to which the first fixed electrode and the second fixed electrode are fixed, the fixing plate having an electrically insulating property and facing the diaphragm,
wherein the first fixed electrode and the second fixed electrode are disposed on the fixing plate on a side closer to the diaphragm.

6. The MEMS microphone as claimed in claim 5, wherein the fixing plate has a protrusion that fills a gap between the first fixed electrode and the second fixed electrode.

7. The MEMS microphone as claimed in claim 5, further comprising a semiconductor substrate having a through-hole where the diaphragm faces,
wherein the diaphragm, the first fixed electrode, the second fixed electrode, and the fixing plate are formed on the semiconductor substrate by using a semiconductor manufacturing technique.

* * * * *